United States Patent
Burgermeister et al.

(10) Patent No.: US 12,426,188 B2
(45) Date of Patent: Sep. 23, 2025

(54) FREQUENCY CONVERTER CLASS

(71) Applicant: Lenze Swiss AG, Romanshorn (CH)

(72) Inventors: Andreas Burgermeister, Mauren (CH); Beat Heim, Wilen (CH); Dieter Tanner, Schocherswil (CH)

(73) Assignee: Lenze Swiss AG, Romanshorn (CH)

( * ) Notice: Subject to any disclaimer, the term of this patent is extended or adjusted under 35 U.S.C. 154(b) by 488 days.

(21) Appl. No.: 17/779,294

(22) PCT Filed: Nov. 25, 2020

(86) PCT No.: PCT/EP2020/083389
§ 371 (c)(1),
(2) Date: Oct. 7, 2022

(87) PCT Pub. No.: WO2021/105227
PCT Pub. Date: Jun. 3, 2021

(65) Prior Publication Data
US 2023/0014942 A1 Jan. 19, 2023

(30) Foreign Application Priority Data
Nov. 25, 2019 (DE) .................... 10 2019 218 206.2

(51) Int. Cl.
*H05K 5/06* (2006.01)
*H05K 7/14* (2006.01)

(52) U.S. Cl.
CPC ......... *H05K 5/061* (2013.01); *H05K 7/14324* (2022.08)

(58) Field of Classification Search
CPC .................................................... H05K 7/1432
See application file for complete search history.

(56) References Cited

U.S. PATENT DOCUMENTS

| | | | |
|---|---|---|---|
| 6,091,604 A | 7/2000 | Plougsgaard et al. | |
| 9,380,713 B2 * | 6/2016 | Leon | H05K 7/14322 |
| 10,306,792 B2 * | 5/2019 | Sturm | H02K 5/225 |

(Continued)

FOREIGN PATENT DOCUMENTS

| | | |
|---|---|---|
| CN | 102800638 A | 11/2012 |
| CN | 203967911 U | 11/2014 |

(Continued)

OTHER PUBLICATIONS

German-language Office Action issued in German Application No. 10 2019 218 206.2 dated Aug. 27, 2020 with English translation (17 pages).

(Continued)

*Primary Examiner* — Carlos Amaya
(74) *Attorney, Agent, or Firm* — Crowell & Moring LLP

(57) ABSTRACT

A frequency converter class contains various types of frequency converters. A first type of frequency converters of the frequency converter class consists of: power electronics, a carrier element, and a housing element of a first housing element type that, in connection with the carrier element, forms a housing for the power electronics, and a second type of frequency converters of the frequency converter class consists of: the power electronics, the carrier element and a (Continued)

housing element of a second housing element type that, in connection with the carrier element, forms a housing for the power electronics.

12 Claims, 3 Drawing Sheets

(56) References Cited

U.S. PATENT DOCUMENTS

| | | | |
|---|---|---|---|
| 10,594,246 B2* | 3/2020 | Li | ............................ H02H 9/02 |
| 2001/0036098 A1* | 11/2001 | Larikka | ................ H05K 7/1432 |
| | | | 363/157 |
| 2005/0272319 A1 | 12/2005 | Schmidt et al. | |

FOREIGN PATENT DOCUMENTS

| | | |
|---|---|---|
| CN | 203967958 U | 11/2014 |
| CN | 204442855 U | 7/2015 |
| CN | 105356725 A | 2/2016 |
| CN | 106463917 A | 2/2017 |
| CN | 206564535 U | 10/2017 |
| CN | 109510437 A | 3/2019 |
| CN | 209088801 U | 7/2019 |
| DE | 44 10 171 C1 | 4/1995 |
| DE | 198 13 639 A1 | 11/1999 |
| DE | 10 2008 027 584 B3 | 12/2009 |
| DE | 10 2015 200 375 A1 | 7/2016 |
| WO | WO 2004/026013 A1 | 3/2004 |

OTHER PUBLICATIONS

MBI GmbH: Frequency inverter for 1-AC motors VersiDrive i . . . /E3S/IP66/IP66S up to 1.1kW; Catalogue extract; Nov. 2016. URL:http://www.mbi.gmbh.de/wp-content/uploads/2016/11/Dat_VersiDrive_i_E3S_IP66_D_MBI.pdf (accessed Aug. 26, 2020) (two (2) pages).
MBI GmbH: Frequency converter for single-phase AC motors VersiDrive i . . . /E3S up to 1,IkW; catalogue extract; Nov. 2016. URL:http://www.mbi-gmbh.de/wp-content/uploads/2016/11/Dat_VersiDrive_i_E3S_D_MBI.pdf (accessed Aug. 26, 2020) (two (2) pages).
International Search Report (PCT/ISA/210) issued in PCT Application No. PCT/EP2020/083389 dated Feb. 25, 2021 with English translation (five (5) pages).
German-language Written Opinion (PCT/ISA/237) issued in PCT Application No. PCT/EP2020/083389 dated Feb. 25, 2021 (six (6) pages).
Chinese-language Office Action issued in Chinese Application No. 202080094456.2 dated Jan. 17, 2025 with partial English translation (12 pages).
Chinese-language Office Action issued in Chinese Application No. 202080094456.2 dated Jul. 22, 2025, with partial English translation (18 pages).

* cited by examiner

FREQUENCY CONVERTER CLASS

BACKGROUND AND SUMMARY

The invention relates to a frequency converter class comprising various types of frequency converters.

The object of the invention is the provision of a frequency converter class comprising various types of frequency converters, which can be produced in a simple and cost-effective manner, and which permits a high degree of flexibility.

The frequency converter class comprises various types of frequency converters.

A first type of frequency converters in the frequency converter class comprises the following components: power electronics, for example comprising a three-phase inverter, a carrier element and a housing element of a first housing element type which, in combination with the carrier element, forms a housing for the power electronics.

A second type of frequency converters in the frequency converter class, by way of equivalent components to the first type of frequency converters, also comprises power electronics of the same type and a carrier element of the same type. In this regard, there are no differences between the first type and the second type. The second type of frequency converters in the frequency converter class is distinguished from the first type of frequency converters in the frequency converter class by a housing element of a second housing element type which, in combination with the carrier element, forms a housing for the power electronics.

According to one embodiment, the housing element of the first housing element type is configured such that the frequency converter of the first type assumes a first protection rating. The housing element of the second housing element type is configured such that the frequency converter of the second type assumes a second protection rating, which differs from the first protection rating. The first housing element type can be of identical dimensions to the second housing element type, i.e. of identical length, width, height, etc.

According to one embodiment, the first protection rating is IP 66 according to IEC 60 529 (EN 60 529). To this end, the housing element of the first housing element type can be configured with an enclosed design and can comprise, for example, circumferential seals which are arranged between the housing element and the carrier element. The second protection rating can be, for example, IP 31.

According to one embodiment, the housing element of the first housing element type, particularly in combination with the carrier element, forms a first volume, and the housing element of the second housing element type, particularly in combination with the carrier element, forms a second volume which differs from the first volume.

According to one embodiment, a third type of frequency converters in the frequency converter class, by way of equivalent components to the first type of frequency converters and the second type of frequency converters, also comprises power electronics of the same type and a carrier element of the same type. In this regard, there are no differences between the first type, the second type and the third type. The third type of frequency converters in the frequency converter class is distinguished from the first type or second type of frequency converters in the frequency converter class by a housing element of a third housing element type which, in combination with the carrier element, forms a housing for the power electronics.

According to one embodiment, the housing element of the first housing element type is configured such that the frequency converter of the first type assumes a first protection rating, for example IP 66. The housing element of the second housing element type is configured such that the frequency converter of the second type assumes a second protection rating, which differs from the first protection rating, for example IP 31. The housing element of the third housing element type forms a volume, which differs from a volume formed by the first housing element type and/or from a volume formed by the second housing element type.

According to one embodiment, the first type, the second type and the third type of frequency converters in the frequency converter class comprise a removable cover element, by means of which a terminal compartment of the frequency converter can be exposed and reclosed. In the terminal compartment, type-independent terminals of the respective frequency converter can be arranged, by means of which the respective frequency converter can be electrically connected, for example to a three-phase AC motor, sensors, transmitters, an intermediate circuit, a three-phase AC grid, etc. The first type and the second type of frequency converters in the frequency converter class can comprise an identical cover element.

A form-fitted connection can be provided between the carrier element and a housing element of one type, or of all types. Depending upon the protection rating required, a seal can be provided in the region of the form-fitted connection.

According to one embodiment, the cover element is configured with a wedge-shaped design, in order to permit the most unimpeded access possible to the terminal compartment, with the cover element removed or open.

According to one embodiment, only one type, particularly the third type of frequency converters in the frequency converter class comprises a grid system disconnector which, according to its switching states, connects or isolates the corresponding type of frequency converter to or from a three-phase AC grid.

According to one embodiment, the carrier element forms a cooling body, particularly of metal construction, particularly in the form of a casting. The cooling body can comprise cooling ribs, on the side thereof which is averted from the housing element. The cooling body is particularly employed for the cooling of the power electronics, and is preferably connected to the latter in a thermally-conductive manner.

According to one embodiment, the carrier element comprises fastener, by means of which a respective frequency converter can be fastened to its site of attachment in a mechanically detachable manner, for example to a rail in a switch cabinet, within an installation or to a building wall.

According to one embodiment, the first type, the second type and the third type of frequency converters in the frequency converter class comprise a trough-shaped location well and an interface arranged in said location well, wherein an external control device to the frequency converter can be inserted in the location well, and can be coupled via the interface to the respective frequency converter, for the purposes of data exchange. The control device can be, for example, a parameterization device, a WLAN module, etc.

The invention is described in detail hereinafter with reference to the drawings.

BRIEF DESCRIPTION OF THE DRAWINGS

FIG. 5 is a perspective representation of the frequency converter according to FIG. 4, with no safety module plugged in.

DETAILED DESCRIPTION OF THE DRAWINGS

Figure 1:
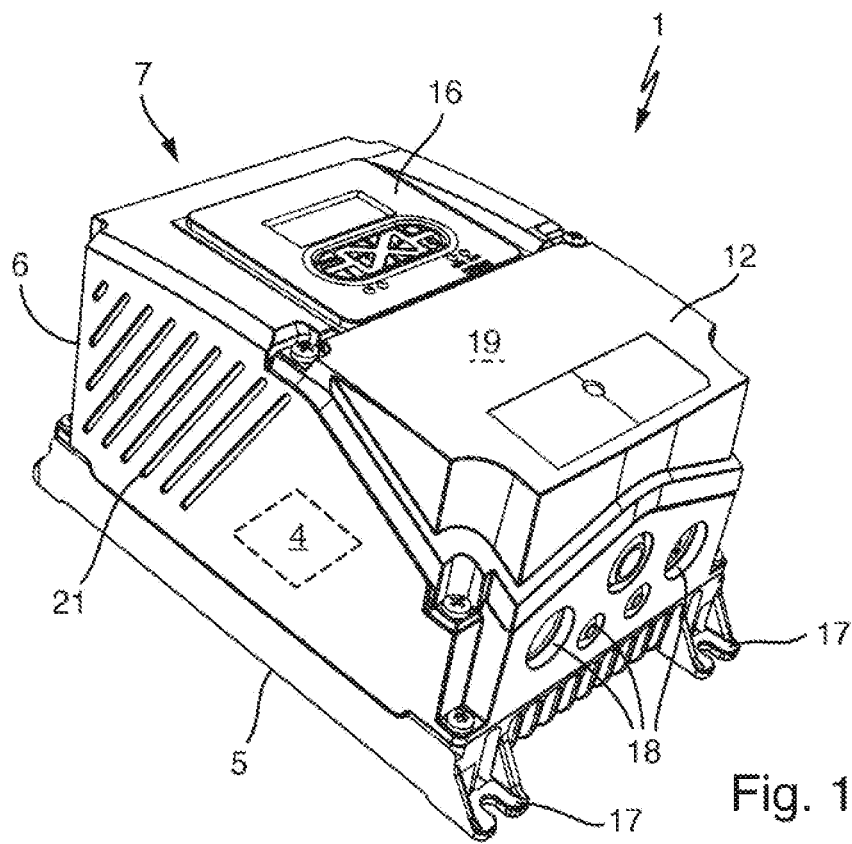
FIG. 1 is a perspective representation of a frequency converter of a first type in a frequency converter class.

FIG. 1 is a perspective representation of a frequency converter 1 of a first type in a frequency converter class.

The first type of frequency converter in the frequency converter class is comprised of power electronics 4, for example a three-phase inverter, a carrier element 5 of metal construction, which simultaneously forms a cooling body, and a housing element 6 of a first housing element type which, in combination with the carrier element 5, forms a housing 7 for the power electronics 4.

The frequency converter 1 assumes a protection rating according to IP 66.

The frequency converter 1 comprises a removable wedge-shaped cover element 12, by means of which a terminal compartment 19 of the frequency converter 1 can be closed. Where the cover element 12 is removed, terminals of the frequency converter 1 are accessible such that, for example, cables which are led into the terminal compartment 19 via cable infeed openings 18 can be connected to the terminals.

The carrier element 5 comprises fasteners 17, by means of which the frequency converter 1 can be fastened to its site of attachment in a mechanically detachable manner.

Figure 2:
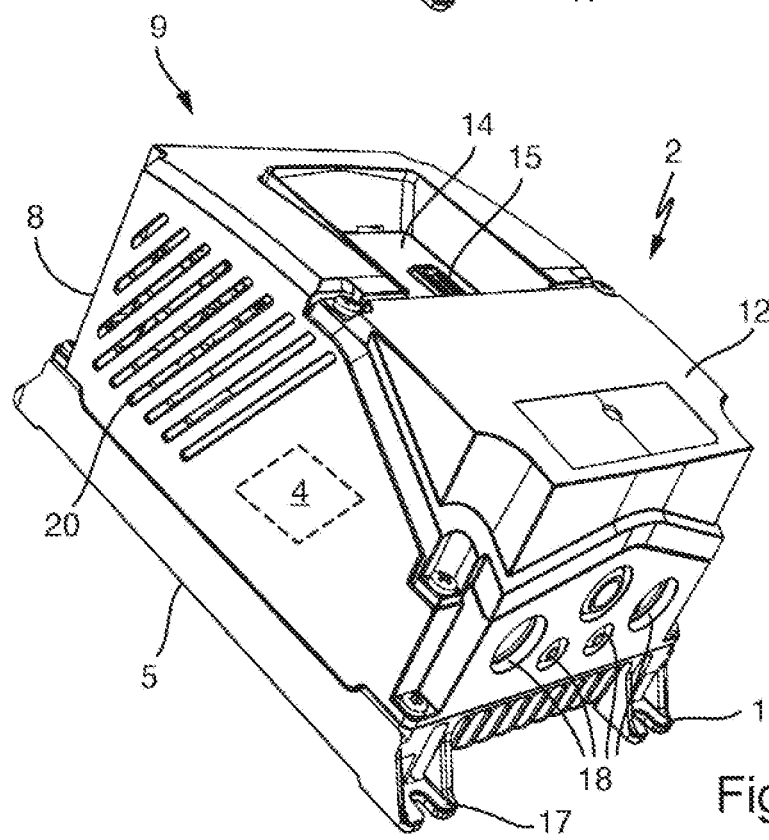
FIG. 2 is a perspective representation of a frequency converter of a second type in a frequency converter class.

An external control device 16 in the form of a parameterization device, which is coupled to the frequency converter 1 via an interface 15 for the purposes of data exchange, is inserted in a location well 14 which is formed in the housing element 6, and in which the interface 15 of the frequency converter 1 is arranged—c.f. FIG. 2.

FIG. 2 shows a perspective representation of a frequency converter 2 of a second type in the frequency converter class and in which, for the purposes of description, an external control device 16 inserted in the location well 14 has been omitted.

The frequency converter 2 of the second type preferably differs from the frequency converter 1 of the first type only with respect to the housing element 8 or housing 9 thereof, which comprises slot-shaped openings 20, whereas the housing element 6 is comprised of solid segments 21. A respective longitudinal extension of the slot-shaped openings 10 or the segments 21, with the frequency converter 1 or 2 installed in its intended orientation, forms an angle of approximately 25 degrees to the horizontal.

The frequency converter 2 of the second type assumes a protection rating according to IP 31, whereas the frequency converter 1 of the first type assumes a protection rating according to IP 66.

In the frequency converter 1 of the first type, having a protection rating according to IP 66, for the achievement of a higher protection rating, seals can additionally be provided between the housing element 6 and the carrier element 5.

Figure 3:
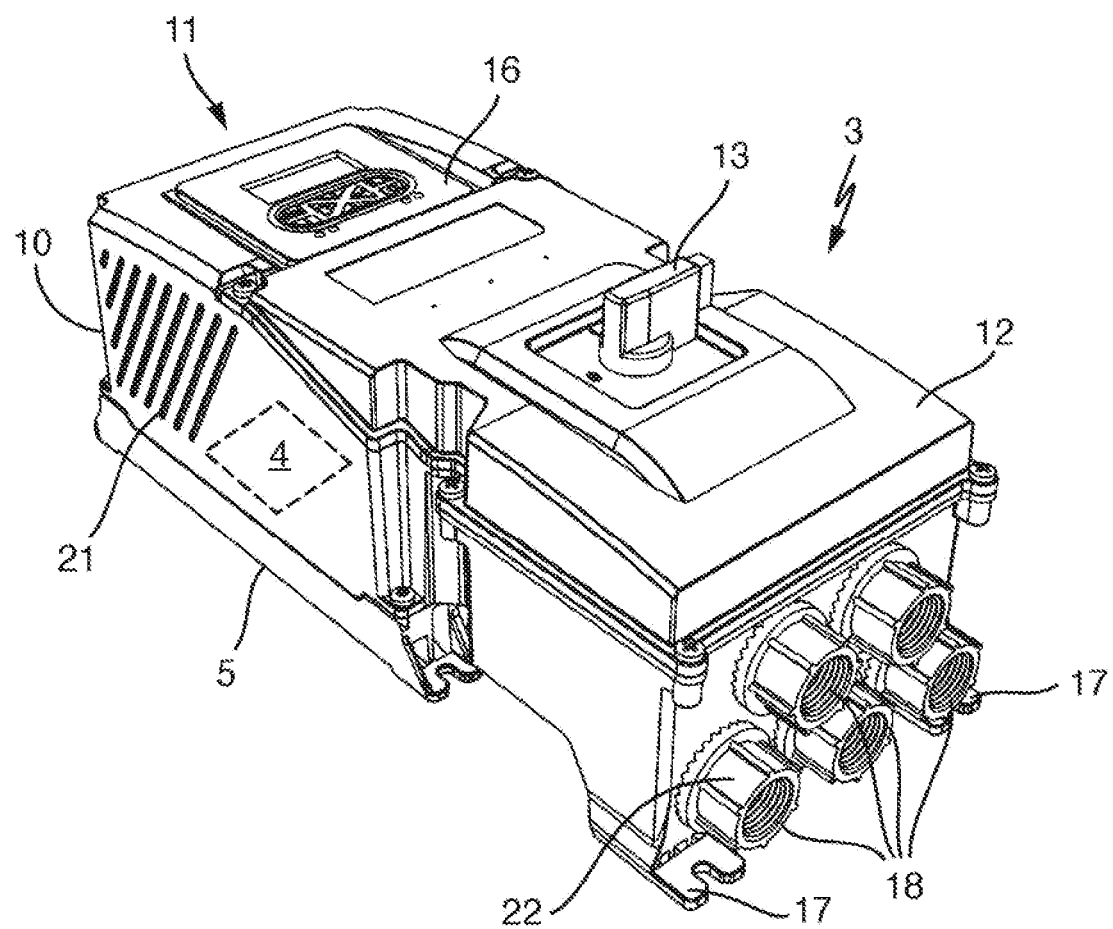
FIG. 3 is a perspective representation of a frequency converter of a third type in a frequency converter class.

FIG. 3 shows a perspective representation of a frequency converter 3 of a third type in the frequency converter class.

The frequency converter 3 of the third type differs from the frequency converters 1 and 2 of the first or second types, inter alia, with respect to the housing element 10 thereof or the housing 11 thereof, which is of a different volume to the housing elements 6 and 8, which are of equal volume.

By way of distinction from the frequency converters 1 and 2, the frequency converter 3 comprises a grid system disconnector 13 for isolation from the grid. The frequency converter 3 can assume a protection rating according to IP 66.

Additionally to the cable infeed openings 18, further openings can be provided in the housing elements 6, 8 and 10, in a snap-out arrangement, in order to permit further types of cable to be led to the housing. Only grid connection and motor connection openings, for example, may be provided as standard.

The housing elements 6, 8, 10 are detachably fastened to the carrier element 5, for example by means of screws.

The cover element 12 can also be detachably fastened to the housing elements 6, 8, 10 by means of screws.

The frequency converter class according to the invention features a high proportion of matching components, including identical power electronics and carrier elements. In essence, the only distinctions are associated with the different housing elements, by means of which the frequency converters are differentiated or classified. This permits cost-effective production and warehousing, with a simultaneously high degree of flexibility.

With reference to FIG. 3, the cable infeed openings 18 can be closed by means of associated sealing plugs 22, in order to achieve the requisite fluid-tightness or protection rating.

Sealing plugs 22 can also be employed in conjunction with the embodiment represented in FIG. 1.

Figure 4:
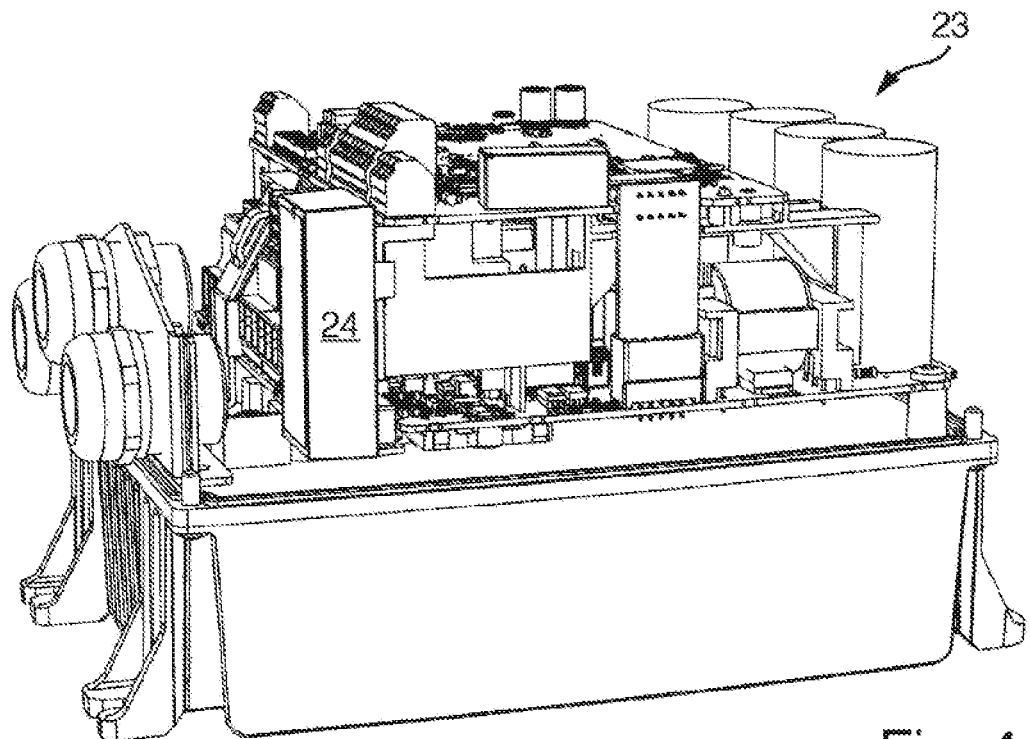
FIG. 4 is a perspective representation of a frequency converter of the first, second or third type with the housing element removed, wherein a safety module is plugged onto a circuit board of the frequency converter.

FIG. 4 shows a perspective representation of a frequency converter 23 of the first, second or third type, with the housing element 6, 8 or 10 removed. The frequency converter 23 comprises a circuit board 26, onto which a safety module 24 is plugged. The plugged-in safety module 24 permits the fulfilment by the frequency converter 23 of specific requirements for functional security.

Figure 5:
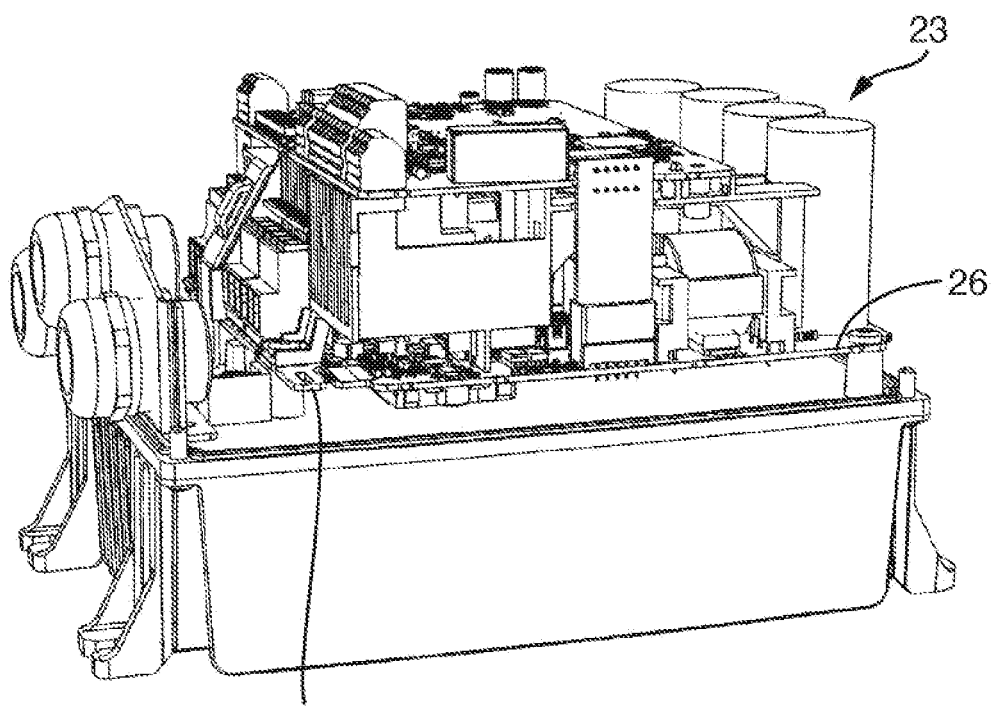

FIG. 5 shows a perspective representation of the frequency converter 23 according to FIG. 4, with the plugged-in safety module 24 removed, as a result of which the behavior of the frequency converter 23 with respect to functional security is altered.

As represented in FIG. 5, the circuit board 26 comprises tabs 25, onto which the safety module 24, as represented in FIG. 4, can be plugged.

The power electronics 4 can be arranged on the circuit board 26.

The invention claimed is:

1. A frequency converter class, comprising various types of frequency converters, wherein
   (i) a first type of frequency converters in the frequency converter class comprises:
      power electronics,
      a carrier element, and
      a housing element of a first housing element type which, in combination with the carrier element, forms a housing for the power electronics, and
   (ii) a second type of frequency converters in the frequency converter class comprises:
      the power electronics,
      the carrier element, and
      a housing element of a second housing element type which, in combination with the carrier element, forms a housing for the power electronics, wherein the first housing element type is a different configuration than the second housing element type, and wherein the power electronics and the carrier element of both the first and second types of frequency converters are respectively of the same type.

2. The frequency converter class according to claim 1, wherein the housing element of the first housing element type is configured such that the frequency converter of the first type assumes a first protection rating, and the housing element of the second housing element type is configured such that the frequency converter of the second type assumes a second protection rating, which differs from the first protection rating.

3. The frequency converter class according to claim 2, wherein the first protection rating is IP 66, and the second protection rating is IP 31.

4. The frequency converter class according to claim 1, wherein the housing element of the first housing element type forms a first volume, and the housing element of the second housing element type forms a second volume, which differs from the first volume.

5. The frequency converter class according to claim 1, wherein (iii) a third type of frequency converters in the frequency converter class comprises:

the power electronics, the carrier element, and a housing element of a third housing element type which, in combination with the carrier element, forms a housing for the power electronics.

6. The frequency converter class according to claim 5, wherein the housing element of the first housing element type is configured such that the frequency converter of the first type assumes a first protection rating, the housing element of the second housing element type is configured such that the frequency converter of the second type assumes a second protection rating, which differs from the first protection rating, and the housing element of the third housing element type forms a volume which differs from a volume formed by the first housing element type and/or from a volume formed by the second housing element type.

7. The frequency converter class according to claim 1, wherein all types of frequency converters in the frequency converter class comprise a cover element, by which a terminal compartment of the frequency converter is closed.

8. The frequency converter class according to claim 7, wherein the cover element is configured with a wedge-shaped design.

9. The frequency converter class according to claim 1, wherein one type of frequency converters in the frequency converter class comprises a grid system disconnector.

10. The frequency converter class according to claim 1, wherein the carrier element forms a cooling body.

11. The frequency converter class according to claim 1, wherein the carrier element comprises at least one fastener, by which a respective frequency converter is fastenable to an associated site of attachment in a mechanically detachable manner.

12. The frequency converter class according to claim 1, wherein all types of frequency converters in the frequency converter class comprise a location well and an interface arranged in said location well, wherein an external control device is insertable in the location well, and is couplable via the interface to the respective frequency converter, for purposes of data exchange.

* * * * *